United States Patent
Lin et al.

(10) Patent No.: US 9,786,592 B2
(45) Date of Patent: Oct. 10, 2017

(54) INTEGRATED CIRCUIT STRUCTURE AND METHOD OF FORMING THE SAME

(71) Applicant: TAIWAN SEMICONDUCTOR MANUFACTURING CO., LTD., Hsinchu (TW)

(72) Inventors: Jeng-Shyan Lin, Tainan (TW); Dun-Nian Yaung, Taipei (TW); Hsing-Chih Lin, Tainan (TW); Jen-Cheng Liu, Hsinchu County (TW); Min-Feng Kao, Chiayi (TW); Hsun-Ying Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/929,040

(22) Filed: Oct. 30, 2015

(65) Prior Publication Data

US 2017/0125341 A1 May 4, 2017

(51) Int. Cl.
*H01L 23/522* (2006.01)
*H01L 23/528* (2006.01)
*H01L 21/768* (2006.01)
*H01L 23/48* (2006.01)
*H01L 23/525* (2006.01)

(52) U.S. Cl.
CPC .... *H01L 23/5226* (2013.01); *H01L 21/76805* (2013.01); *H01L 21/76843* (2013.01); *H01L 21/76877* (2013.01); *H01L 23/481* (2013.01); *H01L 23/522* (2013.01); *H01L 23/528* (2013.01); *H01L 23/525* (2013.01)

(58) Field of Classification Search
USPC .......................................... 257/774; 438/639
See application file for complete search history.

(56) References Cited

U.S. PATENT DOCUMENTS

| | | | | |
|---|---|---|---|---|
| 2001/0021571 A1* | 9/2001 | Koma | ............... | H01L 21/02013 438/459 |
| 2002/0048893 A1* | 4/2002 | Kizilyalli | .......... | H01L 21/28079 438/383 |
| 2005/0221601 A1* | 10/2005 | Kawano | ............ | H01L 21/76898 438/622 |
| 2007/0128755 A1* | 6/2007 | Fuertsch | ............. | B81C 1/00087 438/48 |
| 2008/0054444 A1* | 3/2008 | Tuttle | ................ | H01L 21/76898 257/698 |
| 2011/0089572 A1* | 4/2011 | Tezcan | ............. | H01L 21/76898 257/774 |

(Continued)

*Primary Examiner* — Marcos D Pizarro
*Assistant Examiner* — Lawrence Tynes, Jr.
(74) *Attorney, Agent, or Firm* — Maschoff Brennan

(57) ABSTRACT

An integrated circuit structure with a back side through silicon via (B/S TSV) therein and a method of forming the same is disclosed. The method includes the steps of: receiving a wafer comprising a substrate having a front side that has a conductor thereon and a back side; forming a back side through silicon via (B/S TSV) from the back side of the substrate to penetrate the substrate; and filling the back side through silicon via (B/S TSV) with a conductive material to form an electrical connection with the conductor. Thus a back side through silicon via penetrates the back side of the substrate and electrically connects to the conductor on the front side of the substrate is formed.

20 Claims, 7 Drawing Sheets

(56) References Cited

U.S. PATENT DOCUMENTS

| | | | |
|---|---|---|---|
| 2013/0309812 A1* | 11/2013 | Lee .................. | H01L 23/49822 438/112 |
| 2014/0008757 A1* | 1/2014 | Ramachandran . | H01L 23/49827 257/506 |
| 2015/0069619 A1* | 3/2015 | Chou ................. | H01L 27/1464 257/774 |
| 2015/0221695 A1* | 8/2015 | Park ................. | H01L 27/14636 257/774 |

* cited by examiner

INTEGRATED CIRCUIT STRUCTURE AND METHOD OF FORMING THE SAME

BACKGROUND

Along with the increasing demand for the miniaturization in the semiconductor manufacturing, the package technology has been evolved from two-dimension (2D) to three-dimension (3D) wafer package, so as to further improve the density and performance of circuits in an integrated circuit devices.

In the 3D wafer package, a plurality of wafers are stacked. A through silicon via (TSV) is typically used to connect a wafer to another wafer. However, the typical way to form the TSV introduces defects into the wafers and need to be solved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
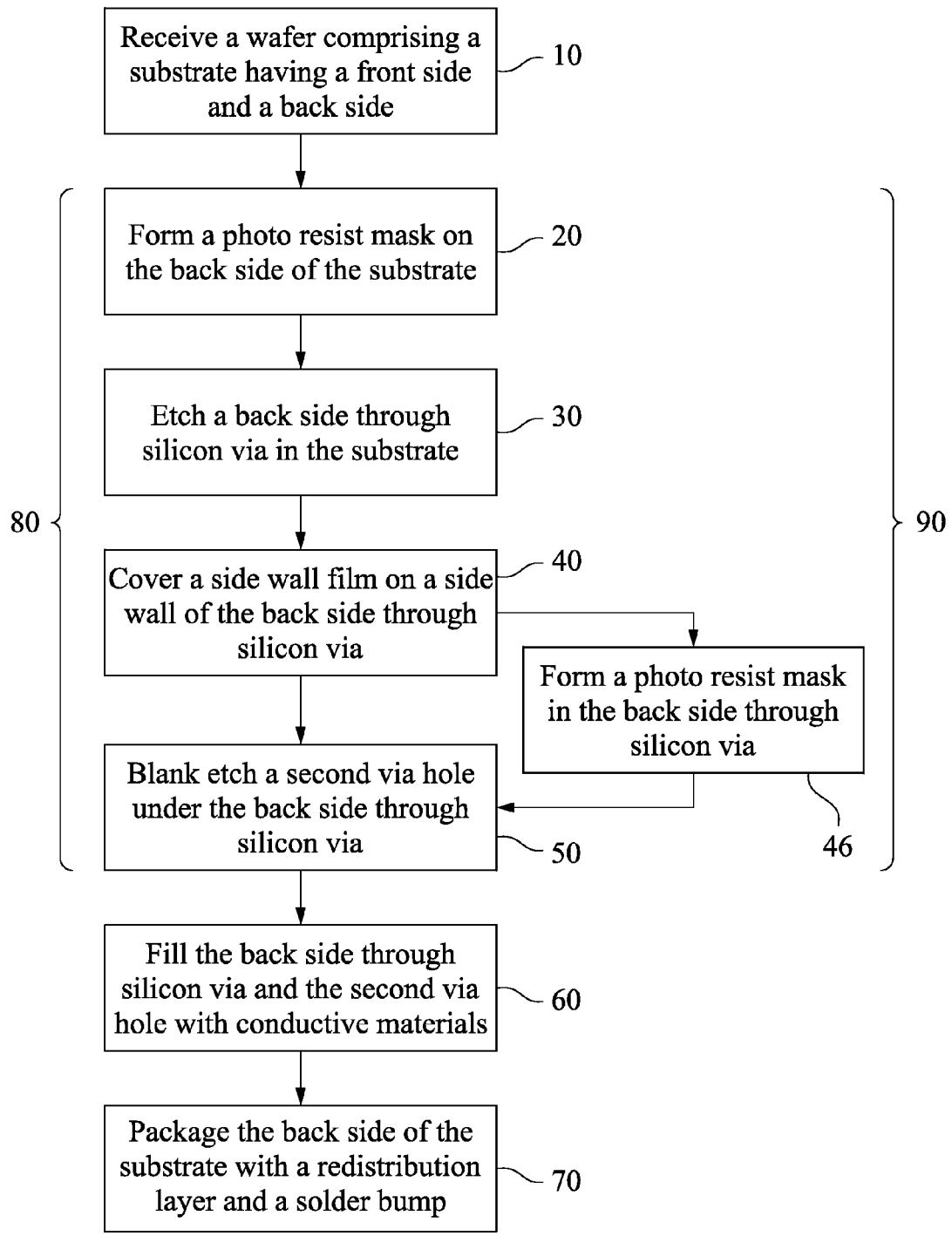
FIG. 1 illustrates a flow chart of manufacturing processes of a back side through silicon via by 1-mask process and 2-mask process in accordance with the embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a conductive plug includes aspects having two or more such plug, unless the context clearly indicates otherwise. Further, spatially relative terms, such as "beneath," "below," "lower," "above," "upper" and the like, may be used herein for ease of description to describe one element or feature's relationship to another element(s) or feature(s) as illustrated in the figures.

In the manufacture of semiconductor, it is very important for an integrated circuit device to thin down a wafer therein, i.e. a silicon substrate, in three-dimension (3D) packaging of a plurality of wafers. To package a plurality of wafers, a through silicon via (TSV) is formed in a semiconductor structure to connect a wafer to an electric element such as a bond pad, an interposer, a redistribution layer, and a wafer. It is known that a traditional front side TSV (F/S TSV) provides a way to bond or connect a wafer to an electric element. However, a size and a thickness of the traditional front side TSV (F/S TSV) are too large to thin down a thickness of the wafer. In a typical method of manufacturing a front side through silicon via (F/S TSV) structure, a front side through silicon via (F/S TSV) extends from a front side of a wafer having semiconductor elements thereon and ends within a substrate of the wafer. Then, the wafer is thinning down by removing a portion of the substrate to expose the front side through silicon via (F/S TSV) so that the front side through silicon via (F/S TSV) connects to the conductive elements such as the bond pads, interposer, redistribution layer, second substrate or the like subsequently. However, during a thinning process of the wafer, cracks or defects may form therein. The defects are more easily to occur for front side through silicon vias (F/S TSVs) which are not in the same highest. Such the defects result in a limitation of a thickness to which the wafer can be thinned down. As a result, the limitation of a thickness of a wafer causes a limitation of a density of circuits in a semiconductor device in a three-dimension (3D) packaging. In this regard, according to various embodiments, a back side TSV (B/S TSV) and a method of manufacturing the same are disclosed.

Figure 5:
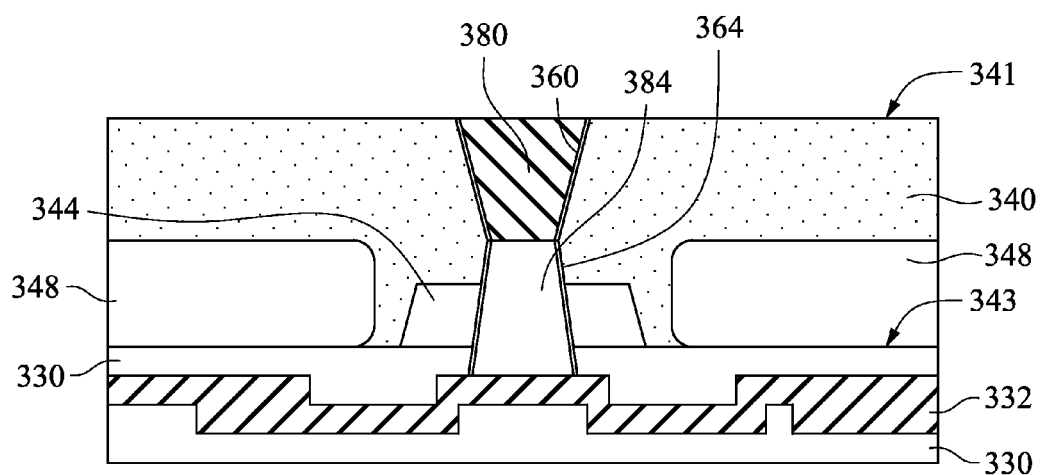
FIG. 5 illustrate a cross sectional view of a structure of an integrated circuit device in accordance with the embodiments.
Figure 6:
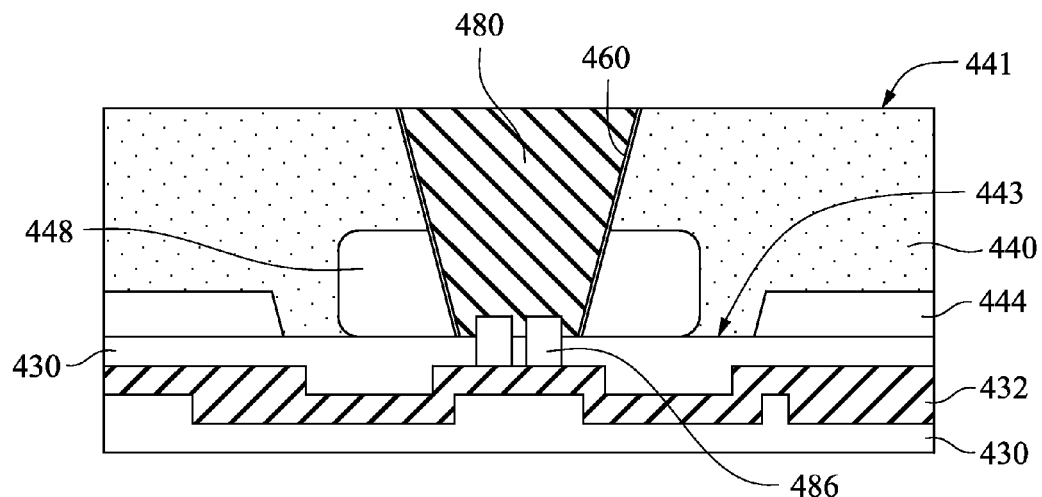
FIG. 6 illustrate a cross sectional view of a structure of an integrated circuit device in accordance with the embodiments.

The manufacturing process of a back side through silicon via (B/S TSV) electrode is summarized in FIG. 1, wherein two different steps, 1-mask process 80 and 2-mask process 90 are included. In the 1-mask process 80, only a photo resist mask is formed on the back side of the substrate during an etching process to form a back side through silicon via (B/S TSV). Then followed by a deposition process of side wall film and a blanket etching process to form a second via hole under the back side through silicon via (B/S TSV), wherein a side wall of the second via hole is continuous with a side wall of the back side through silicon via (B/S TSV). Compared to the 1-mask process 80, the 2-mask process 90 further comprises forming a second photo resist mask in the back side through silicon via (B/S TSV) before the aforementioned blanket etching process. Thus a formed second via hole by the 2-mask process 90 may have a size smaller than a size of the back side through silicon via (B/S TSV) according to a size of an opening in the second photo resist mask. In the following embodiments, the 1-mask process 80 is used to manufacture the back side through silicon via (B/S TSV) in an integrated circuit structure as shown in FIG. 3D, FIG. 5, and FIG. 6, while, the 2-mask process 90 is used in FIG. 4 only.

Referring to FIG. 3A through FIG. 3F, which show various cross sectional views of structures of an integrated circuit device at different stages of the 1-mask process 80 of forming a back side through silicon via (B/S TSV) electrode in accordance with the embodiment of the present disclosure. Now referring to FIG. 2, which shows a cross sectional view of a structure of two wafers 110 bonded together in a contrary direction and a bonding interface 120 therein. In some embodiments, the wafers 110 may be bonded to each other by a suitable process such as a direct bonding process, a plasma activated bonding process, an anodic bonding process, an eutectic bonding process, a glass frit bonding process, an adhesive bonding process, a thermoscompression bonding process, a reactive bonding process, and a transient liquid phase diffusion bonding process. Besides, two wafers can also be bonded together by a front end of a traditional front side through silicon via (F/S TSV) process, wherein the front side through silicon via (F/S TSV) electrode ends in the substrate without protruding the back side of the wafer. Namely, two wafers by the front side through silicon via (F/S TSV) electrode without etching the substrate to expose the front side through silicon via (F/S TSV). It is noticed that a method of manufacturing a back side through silicon via (B/S TSV) electrode in a wafer according to the embodiment is performing after bonding wafers 110.

Figure 2:
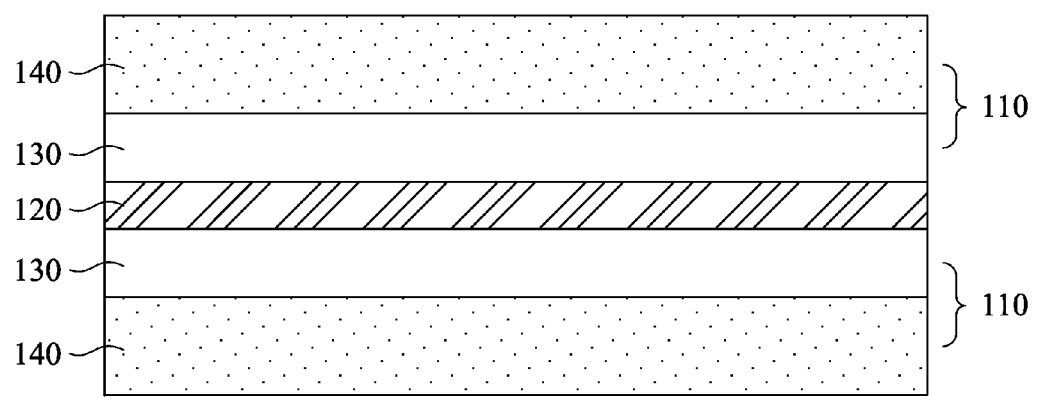
FIG. 2 illustrates a cross sectional view of a structure of a bonding wafers having a bonding interface therein in accordance with the embodiment.
Figure 3A:
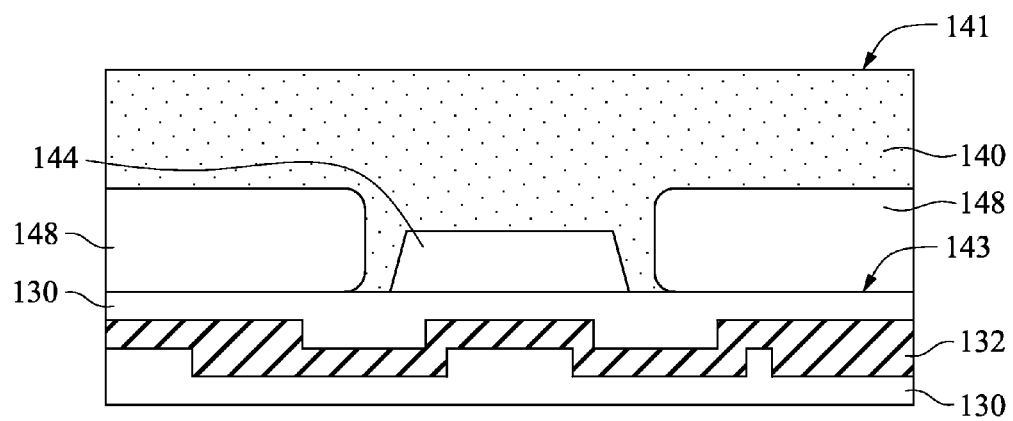
FIG. 3A through FIG. 3F illustrate various cross sectional views of structures of an integrated circuit device at different stages of 1-mask process in accordance with the embodiments.

Next, refer to FIG. 3A, which shows a cross sectional view of a structure of a wafer of the bonding wafers as shown in FIG. 2. For simplicity, only one wafer within one or two objects of the same element shown in the following figures represents a plurality of elements may repeated in a continuous structure in reality. The manufacturing processes related to manufacture a back side through silicon via (B/S TSV) electrode starts from the wafer 110. The wafer 110 comprises a substrate 140 and a dielectric layer 130 adjacent to the substrate 140. Additionally, in a process 10, the substrate 140 has two sides, a back side 141 and a front side 143, wherein the back side 141 is defined to be a surface forming an outside of the substrate 140, while the front side 143 is defined to be an interface between the substrate 140 as well as the adjacent dielectric layer 130. The substrate 140 comprises any suitable material such as, in particular but not limited to, silicon (Si). The substrate 140 is performed with a plurality of manufacturing processes comprising a thermal oxidation process of silicon, a photolithography process, a coating process of photo resist layer, an etching process, a chemical mechanical process (CMP), and an ion implantation process of P ions and B ions. Thus, the wafer comprises a trench (e.g. a shallow trench isolation) 144 of oxides and an active area 148 may comprising a gate electrode, a source/drain region, lightly doped drain (LDD) region, an N-well, an P-well, and twin-well therein. For simplicity, a plurality of structures in the active area 148 is not shown in the following figures.

Adjacent to the substrate 140, the dielectric layer 130 is formed or deposited by a suitable process such as chemical vapor deposition (CVD), atmospheric pressure CVD (APCVD), low pressure CVD (LPCVD), plasma enhanced CVD (PECVD), metal-organic CVD (MOCVD), physical vapor deposition (PVD), atomic layer deposition (ALD), chemical solution deposition, sputtering, and a combination thereof. The dielectric layer 130 is a low k layer and functions as a spacer and a dielectric filter to reduce a parasitic capacitance between two conductors or conductive elements therein. As used herein, the term "low K" refers to the material having a dielectric constant, k, lower than 3.9, which is the k value of $SiO_2$. In the embodiment, the material of the dielectric layer 130 can be carbon-containing dielectric materials, and may further contain nitrogen, hydrogen, oxygen, and combinations thereof. Examples of the material of the dielectric layer 130 include but are not limited to nitrogen-doped silicon carbide (N—SiC), aluminum nitride (AlN), aluminum oxide ($Al_2O_3$), silicon-rich nitride.

Furthermore, the dielectric layer 130 comprises a conductor 132 therein. In the embodiment, the conductor 132 comprises can be any suitable conductive element in a semiconductor device. For example, the conductor may be, but not limited to, an interconnect, a poly silicon gate, a metal gate, a contact, a front side through silicon via (F/S TSV) electrode, and a combination thereof. The material of the conductor 132 varies with a function thereof. Generally, the material of the conductor 132 is selected from a group consisting of poly silicon, copper, silver, tungsten, and a combination thereof.

Still referring to FIG. 3A, the substrate 140 of the wafer 110 is thinned down to a thickness in a range of about 1.5 μm to about 3.0 μm according to the embodiment. The thinning process of the wafer can be any suitable process such as a chemical mechanical polishing (CMP) process and an etching process. It is noticed that since the thickness of the substrate 140 is very small so that a higher packing density of a plurality of integrated circuits devices can be realized. Thus the density of circuits of packaging integrated circuits devices can be largely increased.

Figure 3B:
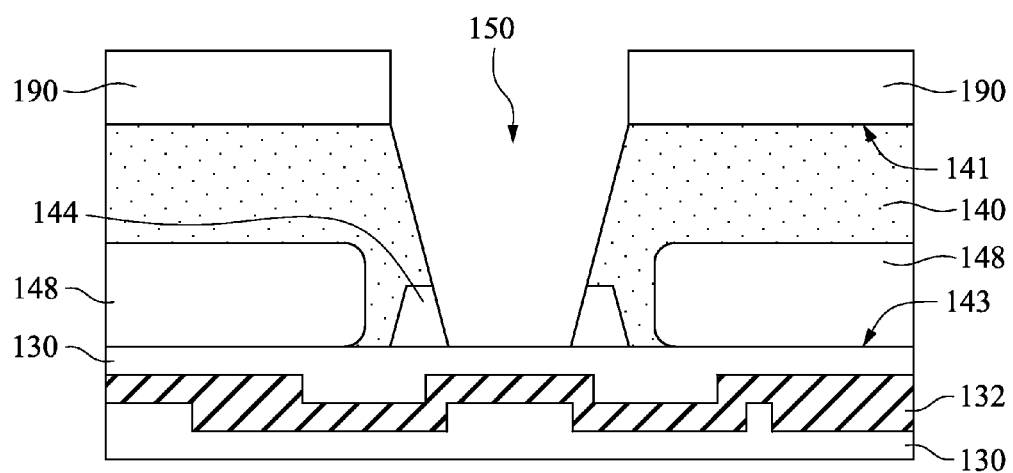

Next referring to FIG. 3B, a photolithography process and an etching process are performed on the back side 141 of the substrate 140 to form a back side through silicon via (B/S TSV) 150. In a process 20, the lithography process may include forming a photo resist layer (not shown) over the substrate, exposing the photo resist layer to form a pattern, performing post-exposure bake processes, and developing the pattern to form a photo resist mask 190. The aforementioned photo resist mask 190 is used to protect portions of the substrate 140 while forming a back side through silicon via (B/S TSV) 150 in the substrate 140 by an etching process as a process 30. In the embodiment as shown in FIG. 3B, the back side through silicon via (B/S TSV) 150 penetrates the substrate 140 and goes through the trench 144 as well. In some embodiments, the back side through silicon via (B/S TSV) 150 does not penetrate the substrate 140. In other embodiments afterward, the back side through silicon via (B/S TSB) 150 may go through an active area instead of the trench 144.

Figure 3C:
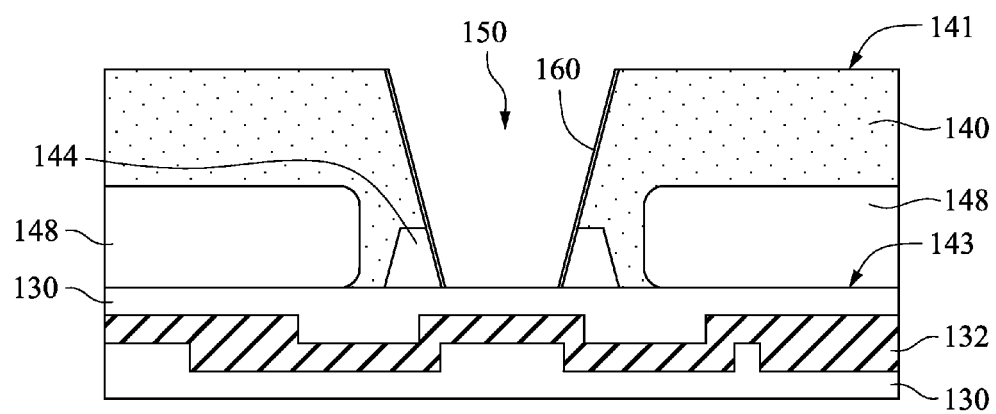
Figure 3D:
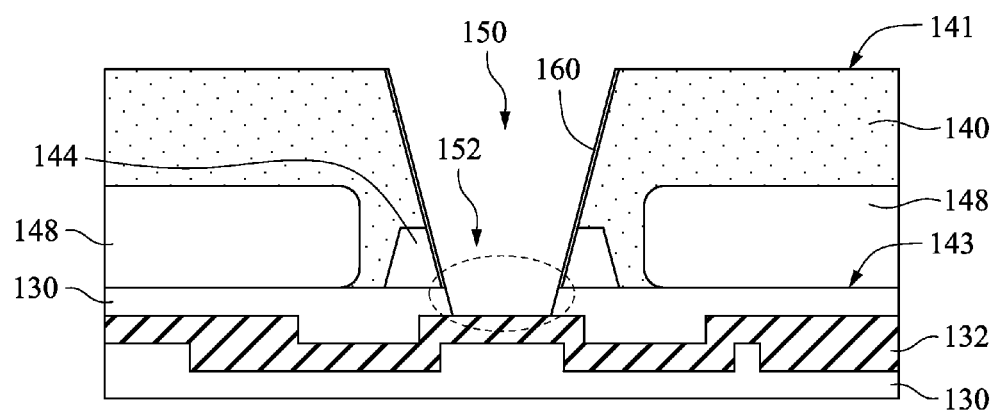

Referring to FIG. 3C, the photo resist mask 190 in FIG. 3B is removed after forming the back side through silicon via (B/S TSV) 150. Then in a process 40, a side wall film 160 is formed or deposited on at least one side of inner walls of the back side through silicon via (B/S TSV) 150. The side wall film 160 functions as an isolation layer between the substrate 140 and the back side through silicon via (B/S TSV) electrode formed in the back side through silicon via (B/S TSV) 150 afterward. Hence, the back side through silicon via (B/S TSV) electrode would not contact the substrate 140 directly. More importantly, the side wall film 160 can prevent metal ions of the back side through silicon via (B/S TSV) electrode from migrating to the surrounding substrate 140, thus a chemical reaction could be avoided. In the embodiments, the side wall film 160 may be composed of a single layer or multiple layers made of insulating materials or barrier materials. Such insulating materials includes but not limited to oxides, nitrides, and a combination thereof. While the barrier material comprises but not limited to tantalum (Ta), tantalum nitride (TaN), titanium (Ti), titanium nitride (TiN), and a combination thereof. Additionally, the deposition process may be any suitable process comprising a plasma enhanced chemical vapor deposition (PECVD) process, a low-pressure chemical vapor deposition (LPCVD) process, an atmospheric pressure chemical vapor deposition (APCVD) process, a spin-on process, or a sputtering process. Then, a baking process is performed to remove water vapors from the side wall film 160 so that afterward back side through silicon via (B/S TSV) electrode material can be adhering onto the side wall film effectively. In other embodiments, the side wall film may form after a blanket etching process discussed below. In other embodiments, a step of forming the side wall film can be eliminated.

Referring to FIG. 3D, in a process 50, a blanket etching process according to the embodiment is performed after depositing the side wall film 160. The blanket etching is used to further removing a portion of the dielectric layer 152 between the back side through silicon via (B/S TSV) 150 and the conductor 132. During the blanket etching process, the side wall film 160 is functional as a protective mask to protect the substrate 140 from being removed. Thus only the portion of the dielectric layer 152 is removed by the blanket etching process to expose the conductor 132. It is noticed that a side wall of the back side through silicon via (B/S TSV) 150 and a side wall of the removed portion of the dielectric layer 152 are continuous so that the back side through silicon via (B/S TSV) 150 and the removed portion of the dielectric layer 152 can be seemed as a single via hole. That is to say, the back side through silicon via (B/S TSV) 150 becomes larger and further extends to the conductor 132 after the blanket etching process. Additionally, a side wall of the removed portion of the dielectric layer 152 is not cover by a side wall film as mentioned above. It is noticed that the back side through silicon via (B/S TSV) has a size in a range of about 0.1 µm to about 10 µm and a thickness in a range of about 1.6 µm to about 3.2 µm, which is slightly larger than a thickness of the substrate. In other embodiment afterward, the removed portion of the dielectric layer 152 is smaller than the back side through silicon via (B/S TSV) 150 so that the removed portion of the dielectric layer 152 and the back side through silicon via (B/S TSV) 150 are two independent parts instead of a single via hole.

Figure 3E:
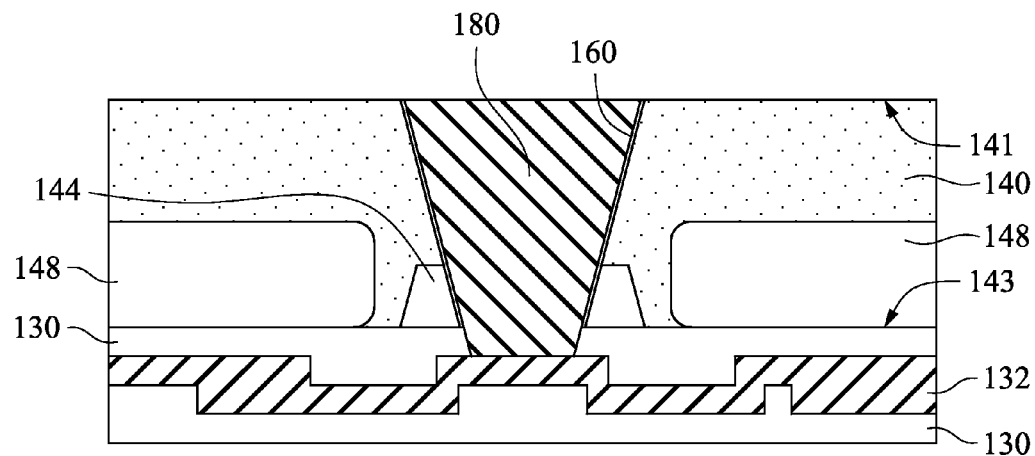

Referring to FIG. 3E, according to a process 60, the back side through silicon via (B/S TSV) 150 as well as the removed portion of the dielectric layer 152 are then filled with a back side through silicon via (B/S TSV) electrode material to form a back side through silicon via (B/S TSV) electrode 180 by any suitable process such as, for example, a sputtering process. Thus a back side through silicon via (B/S TSV) electrode 180 is formed in the substrate 140 and is directly connected to the conductor 132. The back side through silicon via (B/S TSV) electrode material can be any conductive material such as, for example but not limited to, poly silicon, copper, silver, tungsten, and a combination thereof. In the embodiment, a planarization process such as chemical mechanical process (CMP) is performed on a surface of the back side 141 of the substrate 140 after forming the back side through silicon via (B/S TSV) electrode 180.

Figure 3F:
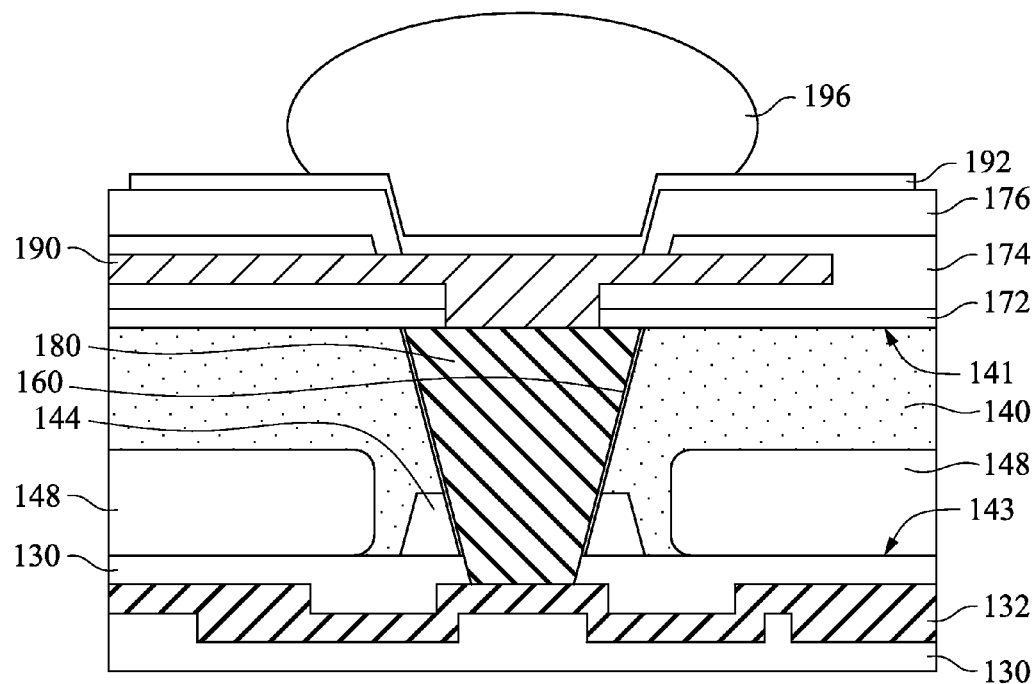

Referring to FIG. 3F, a series of packaging process according to a process 70 is performed on the back side 141 of the substrate 140 after the forming the back side through silicon via (B/S TSV) electrode 180. First, the back side 141 of the substrate 140 is deposited with a first passivation layer 172 thereon. The first passivation layer 172 may comprise a dielectric material such as, for example, silicon nitride, silicon carbide, silicon oxynitride, silicon oxide, polymer materials, and combinations thereof. Additionally, the first passivation layer 172 may have a single layer structure or a composite layer structure with multiple layers made of different materials. The first passivation layer may be formed by any suitable process such as, for example but not limited to, a plasma enhanced chemical vapor deposition (PECVD) process.

Second, a polyimide dielectric layer 174 is deposited on the first passivation layer 172. After depositing the polyimide dielectric layer 174, a photolithography process and an etching process are performed to expose the back side through silicon via (B/S TSV) electrode 180. Third, a redistribution layer (RDL) 190 is formed or deposited on the polymide dielectric layer 174 and is in contact with the back side through silicon via (B/S TSV) electrode 180. The redistribution layer 190 functions as an extra layer of wiring on the wafer 110 so that conductive elements at different locations in the wafer 110 can be bonded out and making wafer-to-wafer bonding simpler. In the embodiment, the redistribution layer 190 can be deposited by any suitable process such as, for example, a sputtering process. Additionally, the redistribution layer 190 can be made of any suitable materials comprising a group consisting of titanium (Ti), aluminum (Al), copper (Cu), and a combination thereof.

Next, a second passivation layer 176 is formed on the redistribution layer 190 as well as the polyimide dielectric layer 174. The second passivation layer 176 may comprise a material similar to the first passivation layer 172 such as, for example, silicon nitride, silicon carbide, silicon oxynitride, silicon oxide, polymer materials, and combinations thereof. Additionally, like the first passivation layer 172, the second passivation layer 176 may be composed of a single layer structure or a composite layer structure with multiple layers made of different materials. The second passivation layer 176 may be formed by any suitable process such as, for example but not limited to, a plasma enhanced chemical vapor deposition (PECVD) process. Then the formed second passivation layer 176 is further patterned and etched to expose the redistribution layer 190.

Then, an under-bump metallization (UBM) layer 192 is sputtered or plated on the second passivation layer 176 and is connected to the redistribution layer 190. The under-bump metallization (UBM) layer 196 is composed of a single layer or a stack of metal layers of different materials selected from a group consisting of chromium (Cr), copper (Cu), silver (Ag), and a combination thereof. Finally, a solder bump 196 is formed on the under-bump metallization (UBM) layer 192 by any suitable process comprising an evaporation process, a sputter process, an electroplating process, and a printing process. Now, a back side through silicon via (B/S TSV) electrode 180 directly connected to the conductor 132 as well as the solder bump 196 is already made. The other embodiments related to different structures are described in the following, however, only one or two figures in one embodiment to illustrate the difference of structures for simplicity and avoiding describing the same manufacturing processes repeatedly.

Figure 4A:
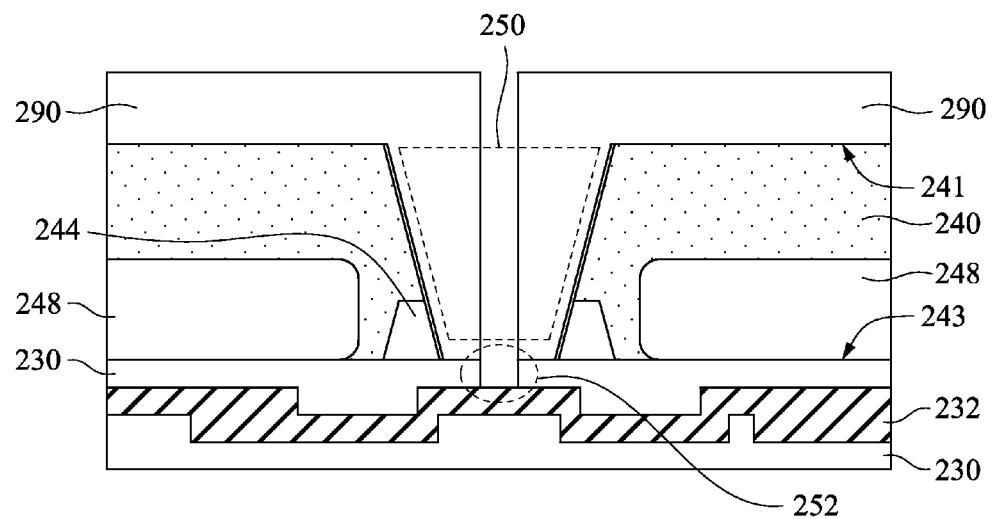
FIG. 4A through FIG. 4B illustrate cross sectional views of structures of an integrated circuit device at different stages of 2-mask process in accordance with the embodiments.

In other embodiments referring to FIG. 4A, the second via hole 252 is further narrowed by a 2-mask process 90 when compared to the second via hole 152 in FIG. 3D. In the 2-mask process 90, a photo resist mask 290 developed by a lithography process including forming a photo resist layer (not shown) over the back side 241 of the substrate 240, exposing the photo resist layer to form a pattern, and performing post-exposure bake processes according to a process 46. It is noticed that the photo resist mask 290 covers a portion of the back side through silicon via (B/S TSV) 250 and leaves an opening that has a size smaller than a size of the back side through silicon via (B/S TSV) 250. Then a blanket etching process according to a process 50 as described in FIG. 3D is performed on the substrate 240 thus form a second via hole 252. The formed second via hole 252 has a size smaller than a size of the back side through silicon via (B/S TSV) 250 and connects to the underlying conductor 232. As mentioned before, the conductor may be, but not limited to, an interconnect, a poly silicon gate, a metal gate, a contact, a front side through silicon via (F/S TSV) electrode, and a combination thereof.

Still referring to FIG. 4A, after forming the second via hole 252, conductive materials are filled into the second via hole 252 and the back side through silicon via (B/S TSV) 250 in sequence to form a composite electrode by a suitable process such as a sputtering process. In the embodiment, the conductive materials filled into the second via hole 252 and the back side through silicon via (B/S TSV) 250 is independently selected from a group consisting of poly silicon, copper (Cu), silver (Ag), tungsten (W), and a combination thereof. In the embodiment, a conductive material of the second via 252 is as same as a material of the back side through silicon via (B/S TSV) 250, an interface between two electrodes would be vanished and thus forming a single back side through silicon via (B/S TSV) electrode 280 with a narrow lower portion as shown in FIG. 4B.

Figure 4B:
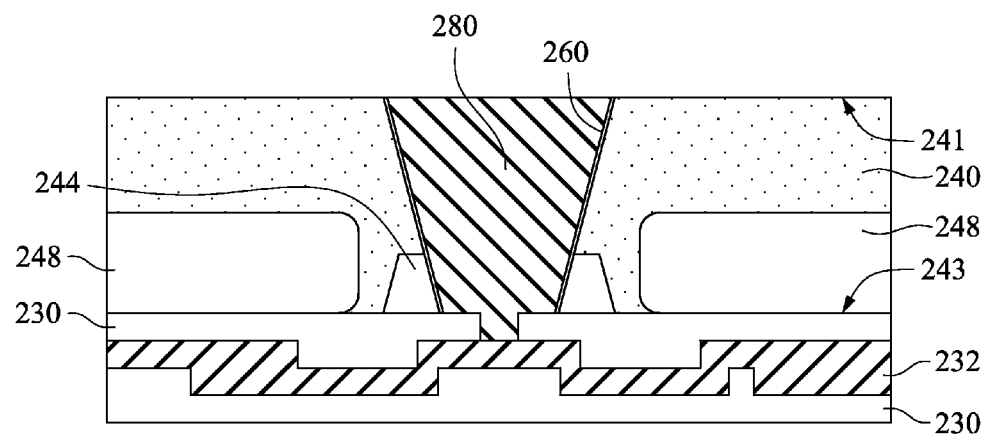

Referring to FIG. 4B, besides the back side through silicon via (B/S TSV) electrode 280, other elements such as the dielectric layer 230, the conductor 232, the substrate 240, the trench 244, the active area 248, and the side wall film 260, may be manufactured by processes and materials as mentioned before as shown in FIG. 3A to FIG. 3E.

In other embodiments referring to FIG. 5, the back side through silicon via (B/S TSV) electrode 380 ended within the substrate 340 without contacting a trench 344 but contacting a front side through silicon via (F/S TSV) electrode 384. The front side through silicon via (F/S TSV) electrode 384 extends from a top surface of the conductor 332 and goes through a dielectric layer 330 and a trench 344. A method of forming the front side through silicon via (F/S TSV) electrode 384 is known to public with ordinary skill in the art, thus the method is not described in detail herein. It is noticed that the front side through silicon via (F/S TSV) electrode 384 has a thickness smaller than a thickness of the substrate 340 so that the front side through silicon via (F/S TSV) electrode 384 ends in the substrate 340. As a result, the method of manufacturing the back side through silicon via (B/S TSV) electrode 380 can also be a way to bond out the front side through silicon via (F/S TSV) electrode 384 without protruding the back side 341 of the substrate 340. As mentioned before, the conductor may be, but not limited to, an interconnect, a poly silicon gate, a metal gate, a contact, a front side through silicon via (F/S TSV) electrode, and a combination thereof.

Still referring to FIG. 5, according to the embodiments, the front side through silicon via (F/S TSV) electrode 384 may comprises a side wall film 364 between the front side through silicon via (F/S TSV) electrode 384 and the substrate 340 as well as the dielectric layer 330. The materials of the front side through silicon via (F/S TSV) electrode 384 and the adjacent side wall film 364 is similar to the material of the back side through silicon via (B/S TSV) electrode 380 and the adjacent side wall film 360 respectively; or independently selected from any other suitable materials. For example, a material of the front side through silicon via (F/S TSV) electrode 384 may comprise poly silicon, copper, silver, tungsten, and a combination thereof. Examples of a material of the side wall film 364 may comprise, but not limited to, oxides, nitrides, tantalum (Ta), tantalum nitride (TaN), titanium (Ti), titanium nitride (TiN), and a combination thereof.

Still referring to FIG. 5, besides the back side through silicon via (B/S TSV) electrode 380 and the front side through silicon via (F/S TSV) electrode 384, other elements such as the dielectric layer 330, the conductor 332, the substrate 340, the trench 344, and the active area 348, may be manufactured by processes and materials as mentioned before as shown in FIG. 3A to FIG. 3E.

In other embodiments referring to FIG. 6, the back side through silicon via (B/S) electrode 480 goes through an active area 448 instead of a trench 444 when compared to FIG. 3D. In the active area 448, a contact 486 extended from the conductor 432 contacts the back side through silicon via (B/S) electrode 480. As mentioned before, the conductor may be, but not limited to, an interconnect, a poly silicon gate, a metal gate, a contact, a front side through silicon via (F/S TSV) electrode, and a combination thereof. In the embodiment, the contact 486 is made of, for example, aluminum (Al) and silicon (Si), and is formed by a process comprising a deposition process and an annealing process. The function of the contact 486 is leading out signals and current from elements in the active area. It is noticed that the back side through silicon via (B/S) electrode 480 can end in the substrate 440, in the dielectric layer 430, or at the front side 443 of the substrate 440. It is noticed that due to a small size of the back side through silicon via (B/S TSV) electrode 480, the back side through silicon via (B/S TSV) electrode 480 can land on the contact 486 and go through the active area 448. In a traditional front side through silicon via (F/S TSV) method, the front side through silicon via (F/S TSV) may have a size larger than a size of the active area so that the front side through silicon via (F/S TSV) is unable to go through the active area.

Still referring to FIG. 6, besides the back side through silicon via (B/S TSV) electrode 480 and the contact 486, other elements such as the dielectric layer 430, the conductor 432, the substrate 440, the trench 444, the active area 448, and the side wall film 460, may be manufactured by processes and materials as mentioned before as shown in FIG. 3A to FIG. 3E.

As aforementioned, a method to increase a three-dimension (3D) packing density of integrated circuit devices is very important for improving a performance of a semiconductor device. It is known that front side through silicon via (F/S) is a traditional method to package semiconductor devices. However, the packing density as well as the density of circuits is limited by a size and a thickness of the front side through silicon via (F/S TSV), wherein the size is about 50 μm and the thickness is around 80 μm. Such a large size of the front side through silicon via (F/S TSV) would decrease an available space for circuits which can be formed in wafers, while such a large thickness of the front side through silicon via (F/S TSV) would increase a thickness of a wafer.

A method provided in the disclosure in accordance with the embodiments to solve the problem described above of a low packaging density as well as a low density of circuits in a semiconductor device caused by the traditional front side through silicon via (F/S TSV) structure is using a novel back side through silicon via (B/S TSV) structure. The back side through silicon via (B/S TSV) has a size in a range of about 0.1 μm to about 10 μm and a thickness in a range of about 1.6 μm to about 3.2 μm while the wafer has a thickness in range of about 1.5 μm to about 3 μm. With a decrease of the size and the thickness of the back side through silicon via (B/S TSV), more space is allowable to put circuits therein in a wafer and more wafers are capable of being packaged in a unit volume. As a result, the limitation of the density of circuits in a semiconductor device caused by the traditional front side through silicon via (F/S TSV) structure is broken by the small back side through silicon via (B/S TSV) and increased to a new level. Additionally, owing to the small size of the back side through silicon via (B/S TSV), the back side through silicon via (B/S TSV) can go through an active area in a wafer to electrically connect to an electric element. Thus a more diversified and complicated design of circuits can be done in a semiconductor device by using the back side through silicon via (B/S TSV). Furthermore, a lower portion of the back side through silicon via (B/S TSV) electrode can be narrowed by a 2-mask process to provide a better performance of metal routing in a wiring process.

In accordance with some embodiments of the present disclosure, a method of manufacturing an integrated circuit structure with a via hole from the back side of the substrate including following steps. First, receiving a wafer having a substrate and the substrate has a front side that has a conductor thereon and a back side. Then forming a via hole from the back side of the substrate by an etching process. And filling a conductive material into the via hole that makes the conductive material be electrically connected to the conductor.

In accordance with some embodiments of the present disclosure, an integrated circuit device is composed of a substrate having a trench and an active area therein, a back side through silicon via, a conductive material, and an interconnect. The active area further has a contact therein. The back side through silicon via penetrates the substrate, and the conductive material is filled in the through silicon via to form an electrical connection to the interconnect.

In accordance with some embodiments of the present disclosure, an integrated circuit structure is composed of a substrate comprising a front side having an conductor thereon and a back side, a trench therein, a first via hole filled with a first conductive material, a second via hole filled with a second conductive material and a conductor. The first via hole contacts the back side of the substrate and ends in the substrate, while the second via hole connected to the first via hole and protrudes the front side of the substrate. The first conductive material filled in the first via hole is directly connected to the second conductive material filled in the second via hole. And the second conductive material filled in the second via hole is electrically connected to the conductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit structure, the method comprising:
   receiving a substrate having a front side that comprises a conductor thereon and a back side;
   thinning down the substrate from the back side of the substrate;
   forming a first photo resist mask to etch a first via hole from the back side of the substrate without exposing the conductor;
   forming a side wall film on a side wall of the first via hole without covering a bottom of the first via hole;
   forming a second photo resist mask covering a first portion of the bottom of the first via hole, wherein a second portion of the bottom of the first via hole is exposed by the second photo resist mask;
   etching a second via hole through the second portion of the bottom of the first via hole to expose the conductor, wherein the second via hole has a size smaller than a size of the first via hole; and
   filling the first and second via holes with a conductive material to be electrically connected to the conductor.

2. The method of claim 1, wherein the first via hole is tapered toward the conductor.

3. The method of claim 1, wherein the etching the second via hole is stopped by the conductor.

4. The method of claim 1, wherein the etching the first via hole is stopped by a dielectric layer covering the conductor.

5. An integrated circuit device comprising:
   a substrate having a front side that comprises an interconnect thereon and a back side, the substrate comprising a shallow isolation trench and an active area having a contact therein;
   a first through silicon via etched from the front side to penetrate the shallow isolation trench;
   a first conductive material filled within the first through silicon via, wherein the first conductive material has a portion protruding from the shallow isolation trench into the substrate;
   a second through silicon via etched from the back side to penetrate the substrate and connected to the first through silicon via;
   a second conductive material filled within the second through silicon via and electrically connected to the first conductive material and the interconnect; and
   a dielectric side wall film on a side wall of the protruding portion of the first conductive material.

6. The integrated circuit device of claim 5, wherein the interconnect comprises a poly silicon gate, a metal gate, a conductive layer, a front side through silicon via electrode, or a combination thereof.

7. The integrated circuit device of claim 5, wherein the first conductive material is tapered toward the second conductive material.

8. The integrated circuit device of claim 5, wherein the second conductive material is tapered toward the first conductive material.

9. The integrated circuit device of claim 5, wherein the dielectric side wall film is in contact with the substrate.

10. The integrated circuit device of claim 5, wherein the dielectric side wall film is in contact with the side wall of the protruding portion of the first conductive material.

11. The integrated circuit device of claim 5, wherein the first conductive material is disposed between the second conductive material and the interconnect.

12. The integrated circuit device of claim 5, further comprising a dielectric layer on the front side of the substrate.

13. An integrated circuit structure comprising:
   a substrate having a front side that comprises a conductor thereon and a back side, the substrate comprising a trench therein;

a first via hole etched from the back side of the substrate;

a second via hole etched from the front side of the substrate and connected to the first via hole;

a first conductive material filled within the first via hole;

a second conductive material filled within the second via hole and electrically connected to the conductor, wherein the second conductive material has a portion protruding from the trench into the substrate; and a first dielectric side wall film on a side wall of the protruding portion of the second conductive material.

14. The integrated circuit structure of claim 13, further comprising a second dielectric side wall film on a side wall of the first via hole.

15. The integrated circuit structure of claim 14, wherein the second dielectric side wall film has opposite first and second surfaces, the first surface is in contact with the first conductive material, and the second surface is in contact with the substrate.

16. The integrated circuit structure of claim 13, wherein the first via hole ends in the substrate without contacting the trench.

17. The integrated circuit structure of claim 13, wherein the first conductive material is tapered toward the front side of the substrate.

18. The integrated circuit structure of claim 13, wherein the second conductive material is tapered toward the back side of the substrate.

19. The integrated circuit structure of claim 13, wherein the first dielectric side wall film has opposite first and second surfaces, the first surface is in contact with the second conductive material, and the second surface is in contact with the substrate.

20. The integrated circuit structure of claim 13, further comprising a dielectric layer on the front side of the substrate, and the second conductive material is electrically connected to the conductor by a contact through the dielectric layer.

* * * * *